US012609060B2

(12) United States Patent
Lee et al.

(10) Patent No.: US 12,609,060 B2
(45) Date of Patent: Apr. 21, 2026

(54) DISPLAY APPARATUS

(71) Applicant: LG Display Co., Ltd., Seoul (KR)

(72) Inventors: Cheolsu Lee, Paju-si (KR); Jinho Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/089,847

(22) Filed: Mar. 25, 2025

(65) Prior Publication Data

US 2026/0038399 A1 Feb. 5, 2026

(30) Foreign Application Priority Data

Jul. 31, 2024 (KR) .......................... 10-2024-010739

(51) Int. Cl.
| | |
|---|---|
| *G09G 3/3258* | (2016.01) |
| *G09G 3/00* | (2006.01) |
| *G09G 3/3233* | (2016.01) |
| *H10K 59/131* | (2023.01) |

(52) U.S. Cl.
CPC ........... *G09G 3/006* (2013.01); *G09G 3/3233* (2013.01); *H10K 59/131* (2023.02); *G09G 2300/0842* (2013.01); *G09G 2310/08* (2013.01); *G09G 2330/04* (2013.01); *G09G 2330/12* (2013.01)

(58) Field of Classification Search
CPC ...................................................... G09G 3/006
See application file for complete search history.

(56) References Cited

U.S. PATENT DOCUMENTS

| | | | | |
|---|---|---|---|---|
| 2017/0004773 A1* | 1/2017 | Kim | ....................... | G09G 3/006 |
| 2023/0057700 A1* | 2/2023 | Kim | ....................... | G09G 3/006 |

FOREIGN PATENT DOCUMENTS

| | | |
|---|---|---|
| KR | 20200026522 A | 3/2020 |
| KR | 20230026673 A | 2/2023 |

* cited by examiner

*Primary Examiner* — Abdul-Samad A Adediran

(74) *Attorney, Agent, or Firm* — Seed Intellectual Property Law Group LLP

(57) ABSTRACT

The present disclosure relates to a display apparatus, and the display apparatus includes a display panel on which a plurality of sub-pixels are disposed, the plurality of sub-pixels each including an organic light-emitting diode, a base voltage node connected to a cathode electrode of the organic light-emitting diode, a plurality of driving voltage lines disposed on the display panel and configured to supply a driving voltage of the organic light-emitting diode to the plurality of sub-pixels, a controller configured to control a gate driving circuit and a data driving circuit, and a defect detection circuit configured to determine whether a defect occurs in the driving voltage line based on a voltage sensed at the base voltage node, wherein, based on a defect signal output from the defect detection circuit, an output of at least one of the controller, the gate driving circuit, and the data driving circuit is controlled.

19 Claims, 9 Drawing Sheets

DISPLAY APPARATUS

CROSS-REFERENCE TO RELATED APPLICATION

The present application claims priority to Korean Patent Application No. 10-2024-0101739, filed Jul. 31, 2024, the entire contents of which is incorporated herein for all purposes by this reference.

BACKGROUND

Technical Field

The present disclosure relates to a display apparatus.

Description of the Related Art

As the information society develops, various demands for display apparatuses for displaying images are increasing, and various types of display apparatuses such as liquid crystal display (LCD) apparatuses and organic light-emitting diode (OLED) display apparatuses are utilized.

Among these display apparatuses, the OLED display apparatus uses OLEDs that emit light by themselves, and thus has advantages in terms of a fast response speed, a contrast ratio, luminance efficiency, luminance, a viewing angle, etc.

Such an OLED display apparatus may include an OLED disposed in each of a plurality of sub-pixels arranged on a display panel and allow the OLED to emit light through current control flowing in the OLED to control the luminance of each sub-pixel and display an image.

Such a display apparatus includes a driving voltage supply source for supplying various driving voltages required for driving a display panel to a driving circuit and the display panel, and various components for transmitting the driving voltages.

Such a display apparatus includes a display panel in which a plurality of sub-pixels are disposed in a matrix form. The display panel receives scan signals from a gate driving circuit and data voltages from a data driving circuit in order to drive each of the sub-pixels. In addition, the display panel receives a plurality of driving voltages from a power management circuit.

BRIEF SUMMARY

According to the display apparatus in the related art, when a crack occurs in the display panel due to various factors, such as an external impact or overheating, a short circuit may occur in components disposed on driving voltage lines of the display panel. For example, a short circuit may occur in a driving transistor that drives the OLED, or a short circuit may occur in the OLED. When an overcurrent flows in the driving voltage line or the display panel due to such a defect, due to the overcurrent, the voltage line can be short-circuited, or the burnt phenomenon in which the display panel is burned can occur.

Embodiments of the present disclosure are directed to providing a display apparatus in which it is possible to block a path of a current that flows along a driving voltage line when a short circuit is detected in the driving voltage line.

Embodiments of the present disclosure are also directed to providing a display apparatus in which it is possible to omit or simplify a component for blocking a driving voltage when a short circuit occurs in a driving voltage line.

Embodiments of the present disclosure are also directed to providing a display apparatus in which it is possible to reduce heat generation of a control printed circuit board.

Objects of the present disclosure are not limited to the above-described object, and other objects that are not described will be able to be clearly understood by those skilled in the art from the following description.

According to one embodiment, there is provided a display apparatus including a display panel on which a plurality of sub-pixels are disposed, the plurality of sub-pixels each including an organic light-emitting diode, a base voltage node connected to a cathode electrode of the organic light-emitting diode, a plurality of driving voltage lines disposed on the display panel and configured to supply a driving voltage of the organic light-emitting diode to the plurality of sub-pixels, a controller configured to control a gate driving circuit and a data driving circuit, and a defect detection circuit configured to determine whether a defect occurs in the driving voltage line based on a voltage sensed at the base voltage node, wherein, based on a defect signal output from the defect detection circuit, an output of at least one of the controller, the gate driving circuit, and the data driving circuit is controlled.

The defect detection circuit may output the defect signal when the voltage sensed at the base voltage node is a preset reference value or more.

The defect detection circuit may include a base voltage switching transistor connected to the base voltage node, a switching control circuit configured to control switching of the base voltage switching transistor, and a defect sensing circuit configured to compare the voltage sensed at the base voltage node to the preset reference value and output the defect signal.

The defect sensing circuit may output the defect signal to at least one of the switching control circuit, the controller, and the data driving circuit.

The switching control circuit may turn off the base voltage switching transistor so that the base voltage node is floated when receiving the defect signal.

The controller may include a gate clock control circuit configured to control an output of a scan clock signal output to the gate driving circuit based on the defect signal.

The gate clock control circuit may stop the output of the scan clock signal when receiving the defect signal.

The display apparatus may further include a plurality of data lines connected to the data driving circuit and the plurality of sub-pixels, wherein the data driving circuit may include a voltage line control circuit configured to control floating of the data line and the reference voltage line based on the defect signal.

The voltage line control circuit may float the data line and the reference voltage line when receiving the defect signal.

The display apparatus may further include a source-side circuit film on which the data driving circuit is mounted and which is connected to the display panel, a source printed circuit board connected to the source-side circuit film, a connection member connected to the source printed circuit board, and a control printed circuit board which is connected to the source printed circuit board by the connection member and on which the controller is mounted, wherein the defect detection circuit may be mounted on the control printed circuit board.

The display apparatus may further include a first connection line configured to electrically connect the sub-pixel to the defect detection circuit.

The first connection line may be disposed across the control printed circuit board, the connection member, the source printed circuit board, the source-side circuit film, and the display panel.

The first connection line may be disposed across a display area and a non-display area of the display panel.

The display apparatus may further include a second connection line disposed on the control printed circuit board and configured to transmit the defect signal from the defect detection circuit to the controller.

The display apparatus may further include a third connection line disposed across the control printed circuit board, the connection member, the source printed circuit board, and the source-side circuit film and configured to electrically connect the defect detection circuit to the data driving circuit.

According to one embodiment, there is provided a display apparatus including a plurality of sub-pixels each including an organic light-emitting diode, a switching transistor electrically connected to a cathode electrode of the organic light-emitting diode through a base voltage node, a switching control circuit configured to control switching of the switching transistor, and a defect sensing circuit configured to compare a voltage sensed at the base voltage node to a preset reference value and output a defect signal.

The defect sensing circuit may output the defect signal when the voltage sensed at the base voltage node is the preset reference value or more.

The switching control circuit may turn off the base voltage switching transistor so that the base voltage node is floated when receiving the defect signal.

The display apparatus may further include a controller configured to control a gate driving circuit and a data driving circuit that are electrically connected to the plurality of sub-pixels, wherein, based on the defect signal output from the defect sensing circuit, an output of at least one of the gate driving circuit, the data driving circuit, and the controller may be controlled.

The display apparatus may further include a source-side circuit film on which the data driving circuit is mounted and which is connected to the display panel, a source printed circuit board connected to the source-side circuit film, a connection member connected to the source printed circuit board, and a control printed circuit board which is connected to the source printed circuit board by the connection member and on which the controller is mounted, wherein the defect detection circuit may be mounted on the control printed circuit board.

According to the embodiments of the display apparatus, it is possible to block the path of the current that flows along the driving voltage line when a short circuit occurs in the driving voltage line.

According to the embodiments of the display apparatus, it is possible to omit or simplify the component for blocking the driving voltage when a short circuit occurs in the driving voltage line.

According to the embodiments of the display apparatus, it is possible to reduce heat generation of the control printed circuit board.

However, the effects obtainable from the present specification are not limited to the above-described effects, and other effects that are not mentioned will be able to be clearly understood by those skilled in the art to which the present specification pertains from the following description.

BRIEF DESCRIPTION OF THE SEVERAL
VIEWS OF THE DRAWINGS

DETAILED DESCRIPTION

Figure 1:
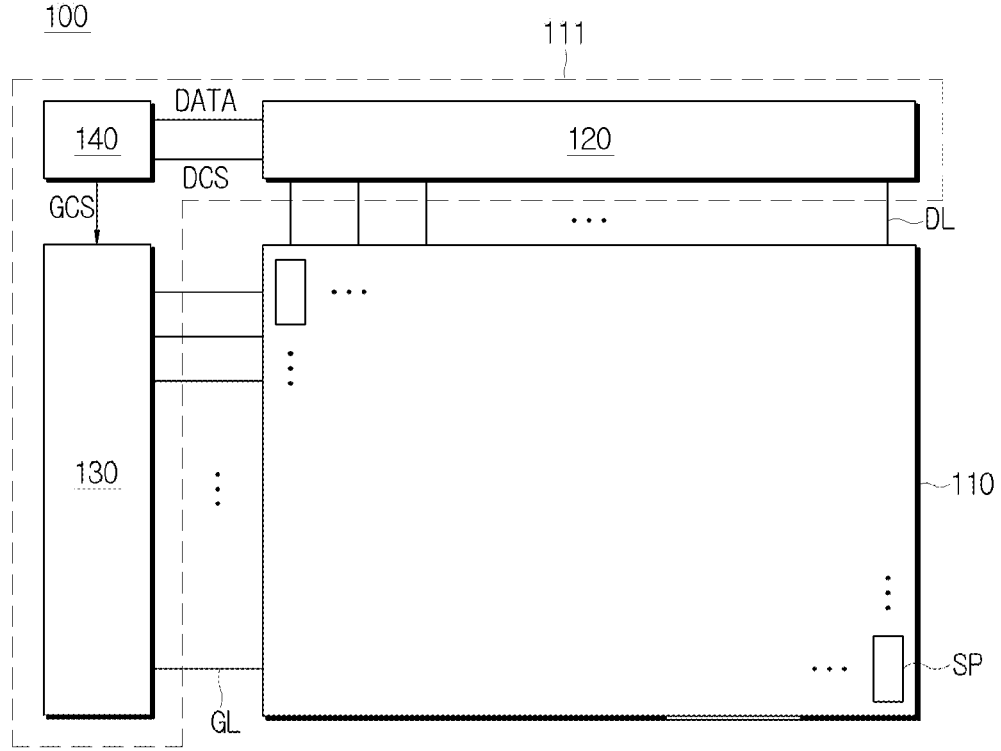
FIG. 1 is a schematic view illustrating a display apparatus according to embodiments of the present disclosure.

Hereinafter, some embodiments of the present disclosure will be described in detail with reference to exemplary drawings. In adding reference numerals to components in each drawing, the same components may have the same reference numerals as much as possible even when they are shown in different drawings. In addition, in the description of the present disclosure, when it is determined that the detailed description of a related known configuration or function may obscure the gist of the present specification, the detailed description thereof may be omitted. When terms "comprise," "have," "consist of," etc., described in the present specification are used, other parts may be added unless "only" is used. When a component is expressed in the singular, it may include a case where the component is provided as a plurality of components unless specifically stated otherwise.

In addition, in the description of the components of the present disclosure, terms such as first, second, A, B, (a), and (b) may be used. These terms are only for the purpose of distinguishing one component from another component, and the nature, sequence, order, etc., of the corresponding component is not limited by these terms.

In the description of the positional relationship of components, when two or more components are described as being "connected," "coupled," or "joined," it should be understood that the two or more components are directly "connected," "coupled," or "joined," but two or more components may be "connected," "coupled," or "joined" with other components "interposed" therebetween. Here, other components may be included in one or more of the two or more components that are "connected," "coupled," or "joined."

Further, the term "connected" is intended to be interpreted with the broadest possible meaning. Specifically, the phrase "A is connected to B" includes both a direct physical or electrical coupling and an indirect coupling facilitated through one or more intermediate components or elements. That is, the term "connected" encompasses both a direct connection between A and B—where no intervening components or elements are present—as well as an indirect connection, where one or more intervening components or elements exist between A and B. Unless expressly specified otherwise (e.g., "directly connected"), these terms do not imply or require direct physical contact.

In the description of the temporal flow relationship related to components, operation methods, manufacturing methods, etc., for example, the temporal sequence relationship or the flow sequence relationship, such as "after," "subsequent to," "then," or "before," it may also include a non-continuous case unless "immediately" or "directly" is used.

Meanwhile, in case that numerical values of components or the corresponding information (e.g., a level) are described, even when there is no separate explicit description, the numerical values or the corresponding information can be construed as including a range of error that may occur due to various factors (e.g., process factors, an internal or external impact, and noise).

Hereinafter, various embodiments of the present disclosure will be described in detail with reference to the accompanying drawings.

FIG. 1 is a schematic view illustrating a display apparatus according to embodiments of the present disclosure.

Referring to FIG. 1, a display apparatus 100 according to the present embodiments may include a display panel 110 in which a plurality of data lines DL and a plurality of gate lines GL are disposed, and a plurality of sub-pixels SP defined by the plurality of data lines DL and the plurality of gate lines GL are arranged in a matrix type, and a driving circuit 111 for driving the display panel 110.

The driving circuit 111 may include a data driving circuit 120 for driving the plurality of data lines DL, a gate driving circuit 130 for driving the plurality of gate lines GL, a controller 140 for controlling the data driving circuit 120 and the gate driving circuit 130, etc.

On the display panel 110, the plurality of data lines DL and the plurality of gate lines GL may be disposed to intersect each other. For example, the plurality of gate lines GL may be arranged in rows or columns, and the plurality of data lines DL may be arranged in columns or rows. Hereinafter, for convenience of description, it is assumed that the plurality of gate lines GL are disposed in rows and the plurality of data lines DL are disposed in columns.

In the display panel 110, other types of lines in addition to the plurality of data lines DL and the plurality of gate lines GL may be disposed.

The controller 140 may supply image data DATA to the data driving circuit 120.

In addition, the controller 140 may supply various control signals DCS and GCS required for the driving operation of the data driving circuit 120 and the gate driving circuit 130 and control the operation of the data driving circuit 120 and the gate driving circuit 130.

The controller 140 may start scanning according to the timing implemented in each frame, convert externally received image data into a data signal format used in the data driving circuit 120, output the converted image data DATA, and control data driving at a proper time according to scanning.

To control the data driving circuit 120 and the gate driving circuit 130, the controller 140 may receive timing signals, such as a vertical synchronization signal Vsync, a horizontal synchronization signal Hsync, an input data enable DE signal, a clock signal CLK, etc., from the outside (e.g., a host system), generate various control signals, and output the generated control signals to the data driving circuit 120 and the gate driving circuit 130.

For example, to control the gate driving circuit 130, the controller 140 may output various gate control signals GCS including a gate start pulse (GSP), a gate shift clock (GSC), a gate output enable signal (GOE), etc.

In addition, to control the data driving circuit 120, the controller 140 may output various data control signals DCS including a source start pulse SSP, a source sampling clock SSC, a source output enable signal SOE, etc.

The controller 140 may be a timing controller used in a typical display technology or a control device capable of further performing other control functions as well as the timing controller.

The controller 140 may be implemented as a component separately from the data driving circuit 120 or implemented as an integrated circuit by being integrated with the data driving circuit 120.

The data driving circuit 120 drives the plurality of data lines DL by receiving the image data DATA from the controller 140 and supplying data voltages to the plurality of data lines DL. Here, the data driving circuit 120 is also referred to as a source driving circuit.

The data driving circuit 120 may include a shift register, a latch circuit, a digital to analog converter DAC, an output buffer, etc.

The data driving circuit 120 may further include one or more analog to digital converters ADCs in some cases.

The gate driving circuit 130 may sequentially drive the plurality of gate lines GL by sequentially supplying the scan signals to the plurality of gate lines GL. Here, the gate driving circuit 130 is also referred to as a scan driving circuit.

The gate driving circuit 130 may include a shift register, a level shifter, etc.

The gate driving circuit 130 may sequentially supply a scan signal SCAN of an on voltage or an off voltage to the plurality of gate lines GL under the control of the controller 140.

When a specific gate line GL is opened by the gate driving circuit 130, the data driving circuit 120 may convert the image data DATA received from the controller 140 into analog data voltages and supply the analog data voltages to the plurality of data lines DL.

The data driving circuit 120 may be located at only one side (e.g., an upper or lower side) of the display panel 110 and in some cases, may be located at both sides (e.g., the upper and lower sides) of the display panel 110 according to a driving method, a panel design method, etc.

The gate driving circuit 130 may be located at only one side (e.g., a left or right side) of the display panel 110 and in some cases, may be located at both sides (e.g., the left and right sides) of the display panel 110 according to a driving method, a panel design method, etc.

The data driving circuit 120 may be implemented by including at least one source driver integrated circuit SDIC.

Each source driver integrated circuit SDIC may be connected to a bonding pad of the display panel 110 by a tape automated bonding (TAB) method or a chip on glass (COG) method or may be directly disposed on the display panel 110. In some cases, each source driving integrated circuit SDIC may be disposed integrally with the display panel 110. In addition, the gate driving circuit 130 may be implemented by a chip on film (COF) method. In this case, each gate driver integrated circuit GDIC may be mounted on a circuit film and electrically connected to the data lines DL of the display panel 110 through the circuit film.

The gate driving circuit 130 may have one or more gate driver integrated circuits GDIC connected to the bonding pad of the display panel 110 by a TAB method or a COG method. In addition, the gate driving circuit 130 may be implemented by a COF method. In this case, each gate driver integrated circuit GDIC included in the gate driving circuit 130 may be mounted on a circuit film and electrically connected to the gate lines GL of the display panel 110 through the circuit film. In addition, the gate driving circuit 130 may be implemented in a gate in panel (GIP) type and may be directly disposed on the display panel 110.

Figure 2:
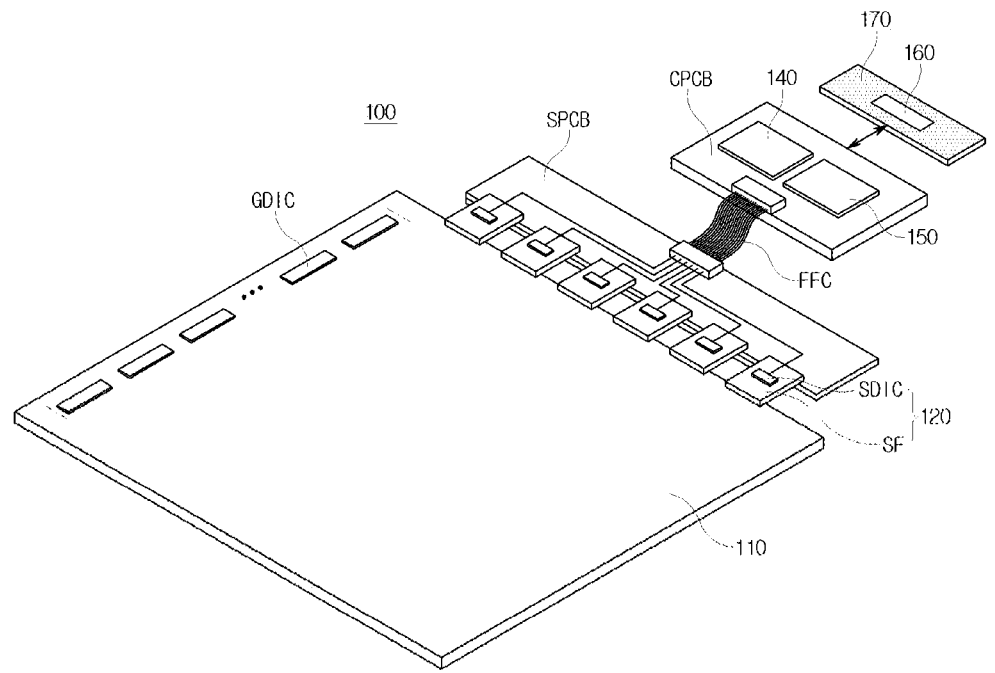
FIG. 2 is a systematic exemplary view of the display apparatus according to the embodiments of the present disclosure.

FIG. 2 is a systematic exemplary view of the display apparatus according to the embodiments of the present disclosure.

The example of FIG. 2 is a case in which each source driver integrated circuit SDIC included in the data driving circuit 120 is implemented by a COF method among various methods (e.g., a TAB, a COG, a COF, etc.), and the gate driving circuit 130 is implemented in a GIP type among various methods (e.g., a TAB, a COG, a COF, a GIP, etc.).

Each of the plurality of source driver integrated circuits SDIC included in the data driving circuit 120 may be mounted on a source-side circuit film SF.

One side of the source-side circuit film SF may be electrically connected to the display panel 110.

On the source-side circuit film SF, lines for electrically connecting the source driver integrated circuits SDICs to the display panel 110 may be disposed.

The display apparatus 100 may include at least one source printed circuit board SPCB for circuit-connecting the plurality of source driver integrated circuits SDICs to other devices, and a control printed circuit board CPCB for mounting control components and various electrical devices.

The other side of the source-side circuit film SF on which the source driver integrated circuit SDIC is mounted may be connected to at least one source printed circuit board SPCB.

That is, the source-side circuit film SF on which source driver integrated circuit SDIC is mounted may have one side electrically connected to the display panel 110 and the other side electrically connected to the source printed circuit board SPCB.

The control printed circuit board CPCB may be provided with the controller 140 for controlling the operation of the data driving circuit 120, the gate driving circuit 130, etc., a power management IC (PMIC) 150 for supplying various voltages or currents to the display panel 110, the data driving circuit 120, the gate driving circuit 130, etc., or controlling various voltages or currents to be supplied, etc.

The at least one source printed circuit board SPCB and the control printed circuit board CPCB may be circuit-connected through at least one connection member. Here, the connection member may be, for example, a flexible printed circuit (FPC), a flexible flat cable (FFC), etc.

The at least one source printed circuit board SPCB and the control printed circuit board CPCB may be implemented integrally with one printed circuit board.

The display apparatus 100 may further include a set board 170 electrically connected to the control printed circuit board CPCB. The set board 170 may also be referred to as a power board.

The set board 170 may be provided with a main power management circuit (M-PMC) 160 for managing the overall power of the display apparatus 100.

The PMIC 150 is a circuit for managing the power of a display module including the display panel 110, the driving circuits 120, 130, and 140, etc., and the M-PMC 160 is a circuit for managing the overall power including the display module and may be lined with the PMIC 150.

Each sub-pixel SP arranged on the display panel 110 may be composed of a circuit element, such as an organic light-emitting diode (OLED) that is a self-light-emitting element, a driving transistor DRT for driving the OLED, etc.

The types and number of circuit elements constituting each sub-pixel SP may be determined in various ways according to the provided functions, design method, etc.

Figure 3:
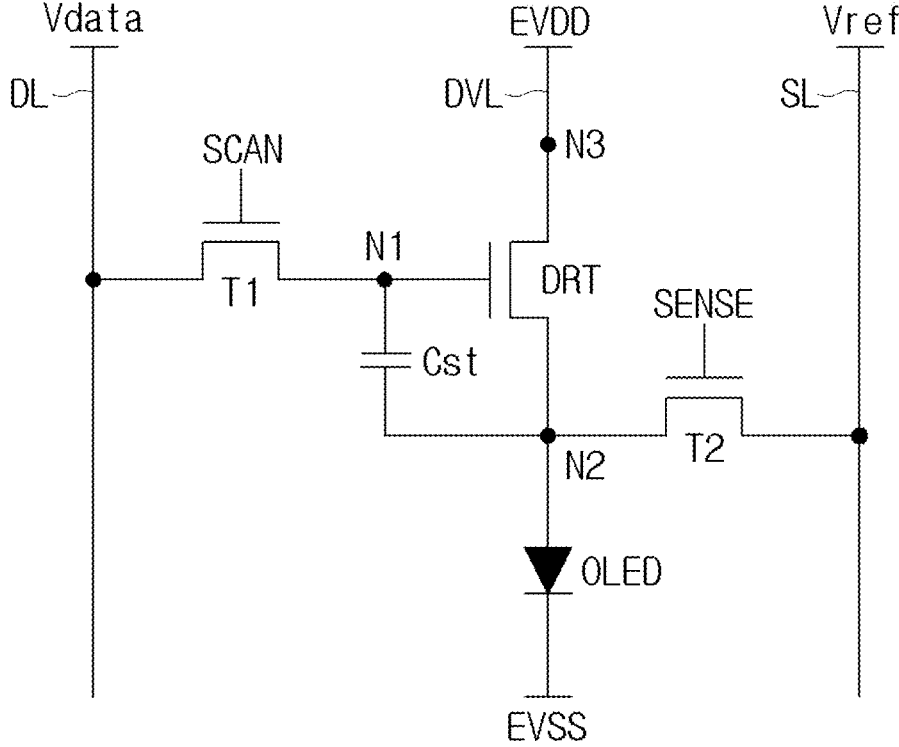
FIG. 3 is an exemplary view of a circuit constituting a sub-pixel in the display apparatus according to the embodiments of the present disclosure.

FIG. 3 is an exemplary view of a circuit constituting a sub-pixel in the display apparatus according to the embodiments of the present disclosure.

Referring to FIG. 3, in the display apparatus 100 according to the embodiments of the present disclosure, the sub-pixel SP may include one or more transistors and capacitors, and an organic light-emitting diode OLED may be disposed as an organic light-emitting diode OLED.

For example, the sub-pixel SP may include a driving transistor DRT, a first transistor T1, a second transistor T2, a storage capacitor Cst, and the OLED.

The driving transistor DRT has a first node N1, a second node N2, and a third node N3. The first node N1 of the driving transistor DRT may be a gate node to which a data voltage Vdata is applied from the data driving circuit 120 through a data line DL when the first transistor T1 is turned on. The second node N2 of the driving transistor DRT may be electrically connected to an anode electrode of the OLED and may be a source node or a drain node. The third node N3 of the driving transistor DRT may be electrically connected to a driving voltage line DVL to which a sub-pixel driving voltage EVDD is applied and may be a drain node or a source node.

In this case, during a display driving period, the sub-pixel driving voltage EVDD required to display images may be supplied through the driving voltage line DVL, and for example, the sub-pixel driving voltage EVDD required to display the images may be a high-potential voltage of 27 V.

The first transistor T1 is electrically connected between the first node N1 of the driving transistor DRT and the data line DL, and the gate line GL is connected to the gate node to operate according to the scan signal SCAN supplied through the gate line GL. In addition, when the first transistor T1 is turned on, the operation of the driving transistor DRT is controlled by transmitting the data voltage Vdata supplied through the data line DL to the gate node of the driving transistor DRT.

The second transistor T2 is electrically connected between the second node N2 of the driving transistor DRT and a sensing line SL, and the gate line GL is connected to the gate node to operate according to a sense signal SENSE supplied through the gate line GL. When the second transistor T2 is turned on, a reference voltage Vref for sensing, which is supplied through the sensing line SL, is transmitted to the second node N2 of the driving transistor DRT. The sensing line SL may be referred to as a reference voltage line.

A voltage of the first node N1 and a voltage of the second node N2 of the driving transistor DRT may be controlled by controlling the first transistor T1 and the second transistor T2, and thus a current for driving the OLED may be supplied.

Gate nodes of the first transistor T1 and the second transistor T2 may be together connected to one gate line GL or connected to different gate lines GL.

When the first transistor T1 and the second transistor T2 are connected to the one gate line GL, the first transistor T1 and the second transistor T2 may be simultaneously controlled by the scan signal SCAN or the sense signal SENSE transmitted through the one gate line GL, and an aperture ratio of the sub-pixel SP may be increased. Such a structure is referred to as a "1 scan type" sub-pixel circuit.

Here, when the first transistor T1 and the second transistor T2 are connected to different gate lines GL, the first transistor T1 and the second transistor T2 may be independently controlled by the scan signal SCAN and the sense signal SENSE that are transmitted through different gate lines GL.

Hereinafter, an example in which the first transistor T1 and the second transistor T2 are connected to one gate line GL, that is, the sub-pixel circuit is implemented as a 1 scan type will be described.

Meanwhile, the transistors disposed in the sub-pixel SP may be formed of both an n-type transistor and a p-type transistor, and here, an example in which the transistors are formed of an n-type transistor is illustrated.

The storage capacitor Cst is electrically connected between the first node N1 and the second node N2 of the driving transistor DRT and maintains the data voltage Vdata for one frame.

The storage capacitor Cst may be connected between the first node N1 and the third node N3 of the driving transistor DRT according to the type of the driving transistor DRT. The anode electrode of the OLED may be electrically connected to the second node N2 of the driving transistor DRT, and a base voltage EVSS may be applied to a cathode electrode of the OLED.

Here, the base voltage EVSS may be a ground voltage or a voltage higher or lower than the ground voltage. In addition, the base voltage EVSS may vary according to a driving state, and for example, the base voltage EVSS during display driving and the base voltage EVSS during sensing driving may be set differently.

The above structure of the sub-pixel SP is a 3T (transistor) 1C (capacitor) structure, which is only an example for description, and the sub-pixel SP may further include one or more transistors or in some cases, may further include one or more capacitors.

Alternatively, each of the plurality of sub-pixels SP may have the same structure, and some of the plurality of sub-pixels SP may have different structures.

The display apparatus 100 according to the embodiments of the present disclosure may use a method of measuring a current flowing due to a voltage charged in the storage capacitor Cst during a characteristic sensing period of the driving transistor DRT in order to effectively sense characteristics values, for example, a threshold voltage or mobility of the driving transistor DRT, which is referred to as current sensing.

That is, by measuring the current flowing due to the voltage charged in the storage capacitor Cst in the characteristic value sensing period of the driving transistor DRT, the characteristic values or changes in characteristic values of the driving transistor DRT in the sub-pixel SP may be identified.

Figure 4:
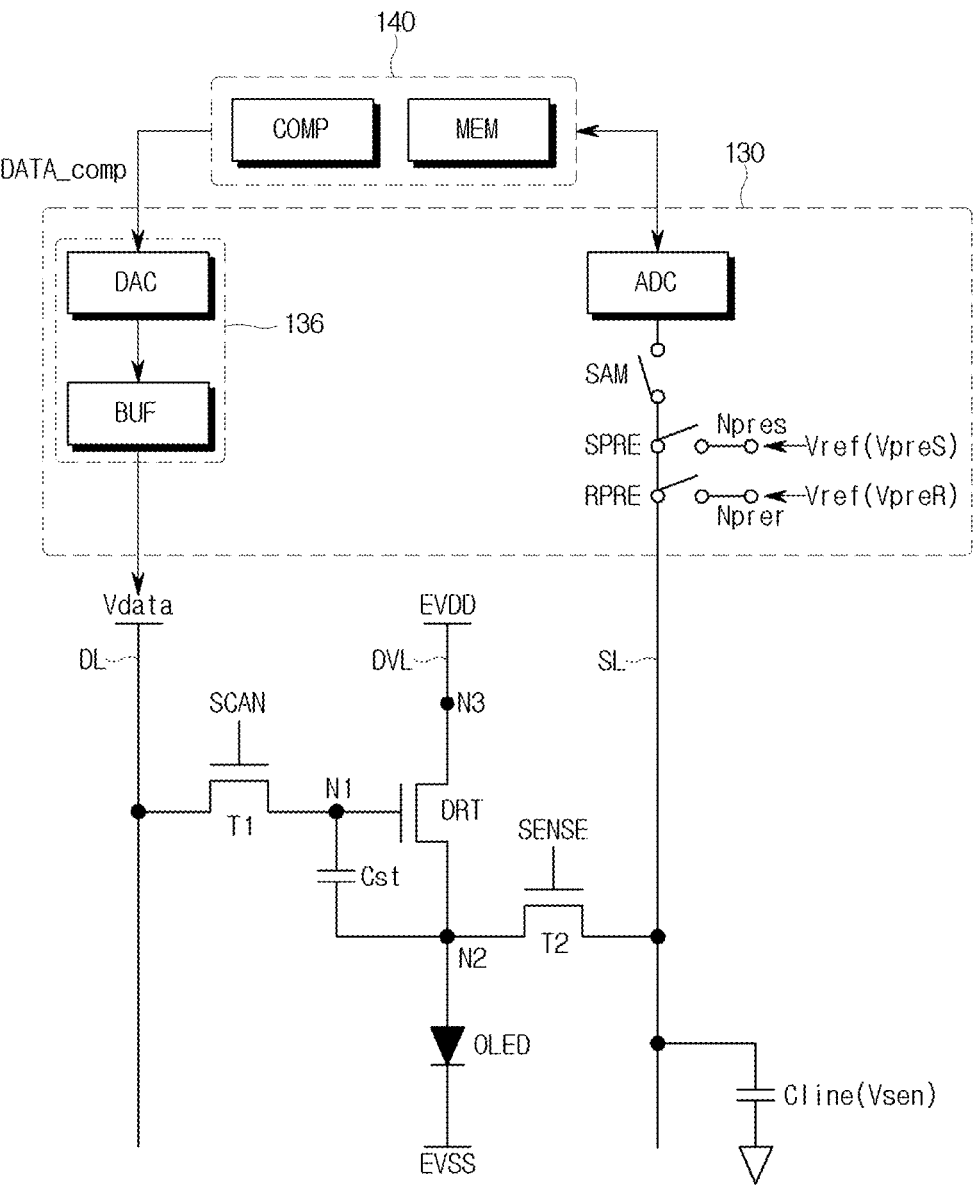
FIG. 4 is a view illustrating an exemplary circuit structure for sensing a characteristic value of a driving transistor in the display apparatus according to the embodiments of the present disclosure.

FIG. 4 is a view illustrating an exemplary circuit structure for sensing a characteristic value of a driving transistor in the display apparatus according to the embodiments of the present disclosure.

Referring to FIG. 4, the display apparatus 100 according to the embodiments of the present disclosure may include components for compensating for a characteristic value deviation of the driving transistor DRT.

For example, in a sensing section of the display apparatus 100, the characteristic values or changes in characteristic values of the driving transistor DRT may be reflected in the voltage (e.g., Vdata–Vth) of the second node N2 of the driving transistor DRT.

When the second transistor T2 is turned on, the voltage of the second node N2 of the driving transistor DRT may correspond to a voltage of the sensing line SL. In addition, a line capacitor Cline on the sensing line SL may be charged by the voltage of the second node N2 of the driving transistor DRT, and the sensing line SL may have a voltage corresponding to the voltage of the second node N2 of the driving transistor DRT due to a sensing voltage Vsen charged in the line capacitor Cline.

The display apparatus 100 may include an analog-to-digital converter ADC for sensing the voltage of the second node N2 of the driving transistor DRT and the voltage of the corresponding sensing line SL and converting the voltages into digital data, and switch circuits SAM and SPRE for sensing the characteristic values of the driving transistor DRT.

The switch circuits SAM and SPRE for controlling sensing driving may include a sensing reference switch SPRE for controlling connection between each sensing line SL and a reference voltage node Npres for sensing, to which the reference voltage Vref is supplied, and a sampling switch SAM for controlling connection between each sensing line SL and the analog-to-digital converter ADC.

Here, the sensing reference switch SPRE is a switch for controlling the sensing driving operation, and the reference voltage Vref supplied to the sensing line SL by the sensing reference switch SPRE during the sensing driving period becomes a sensing reference voltage VpreS.

In addition, the switch circuit may include a display driving reference switch RPRE that controls the display driving operation. The display driving reference switch RPRE may control connection between each sensing line SL and a display driving reference voltage node Nprer to which the reference voltage Vref is supplied.

The display driving reference switch RPRE is a switch used for the display driving operation. The reference voltage Vref supplied to the sensing line SL by the display driving reference switch RPRE during the display driving period corresponds to the display driving reference voltage VpreR.

In this case, the reference switch SPRE and the display driving reference switch RPRE may be provided separately or implemented integrally. The sensing reference voltage VpreS is a reference voltage applied to sense characteristic values during the sensing driving period and may be a voltage value that is the same as or differs from the display driving reference voltage VpreR.

The controller 140 of the display apparatus 100 may include a memory MEM for storing data transmitted from the analog-to-digital converter ADC or storing a reference value in advance, and a compensation circuit COMP for comparing the received data with the reference value stored in the memory MEM and compensating for a deviation in a characteristic value. In this case, compensation values calculated by the compensation circuit COMP may be stored in the memory MEM.

Accordingly, the controller 140 may compensate for digital image data DATA to be supplied to the data driving circuit 120 using the compensation value calculated by the compensation circuit COMP and output a compensated digital image data DATA_comp to the data driving circuit 120.

Accordingly, the data driving circuit 120 may convert the compensated digital image data DATA_comp into an analog signal type data voltage Vdata through a digital-to-analog converter DAC and output the converted data voltage Vdata to the corresponding data line DL through an output buffer BUF. As a result, the characteristic value deviation (a threshold voltage deviation or a mobility deviation) for the driving transistor DRT in the corresponding sub-pixel SP may be compensated.

Meanwhile, the data driving circuit 120 may include a data voltage output circuit 136 including a latch circuit, a digital-to-analog converter DAC, an output buffer BUF, etc., and in some cases, may further include an analog-to-digital converter ADC and various switches SAM, SPRE, and RPRE. On the other hand, the analog-to-digital converter ADC and various switches SAM, SPRE, and RPRE may be located outside the data driving circuit 120.

In addition, the compensation circuit COMP may be present outside the controller 140, but may also be included inside the controller 140, and the memory MEM may be located outside the controller 140 or implemented in the form of a register inside the controller 140.

Meanwhile, when the high-potential driving voltage EVDD is applied in a state in which a defect occurs in the driving voltage line DVL, the driving voltage line DVL may be short-circuited, or the display panel 110 may be burnt. Accordingly, the operation for detecting a short circuit that occurs in the driving voltage line DVL may be performed.

Figure 5:
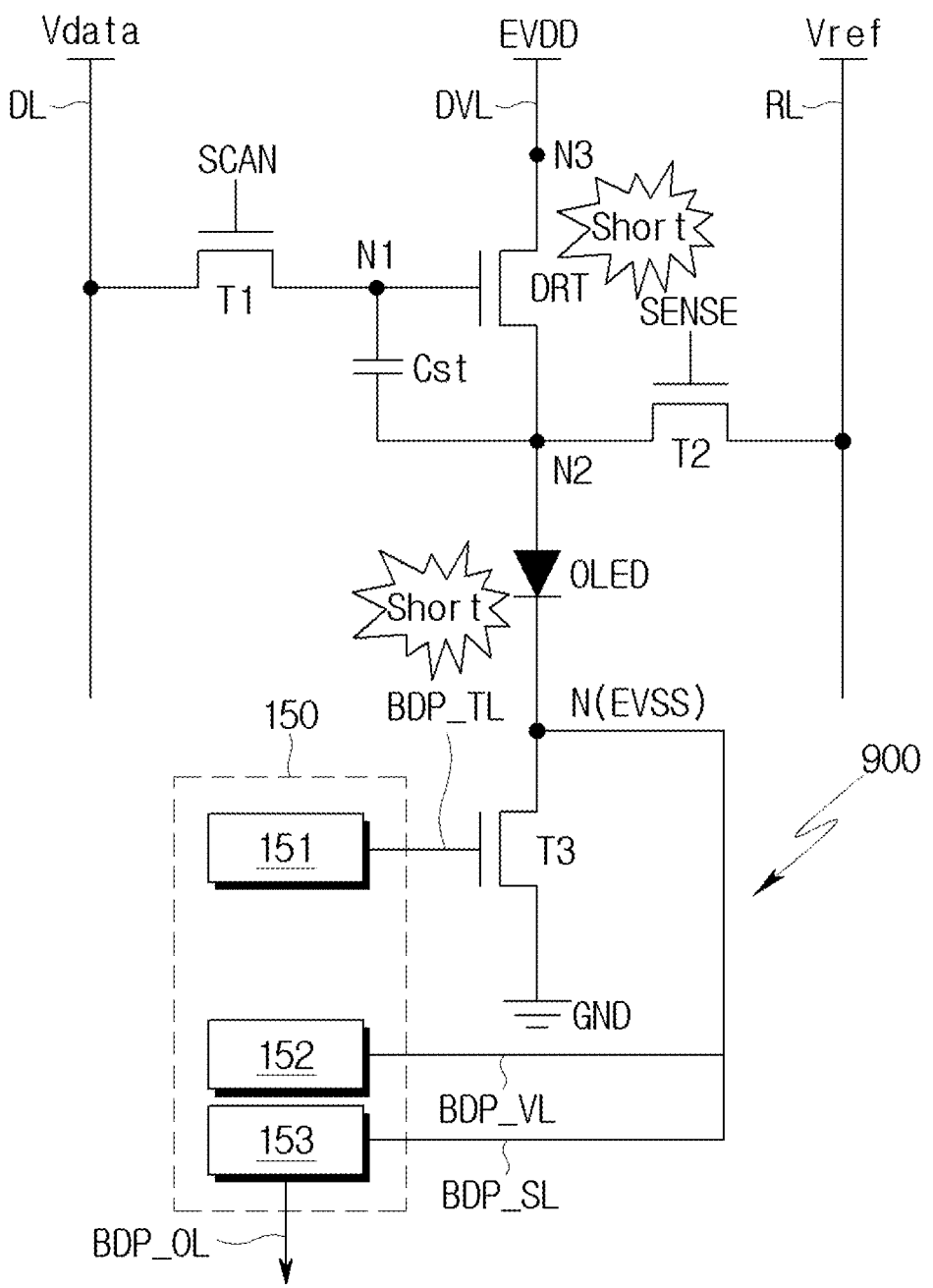
FIG. 5 is a view illustrating an exemplary circuit configuration for detecting a defect that occurs in a driving voltage line in the display apparatus according to the embodiments of the present disclosure.

FIG. 5 is a view illustrating an exemplary circuit configuration for detecting a defect that occurs in a driving voltage line in the display apparatus according to the embodiments of the present disclosure.

Referring to FIG. 5, the display apparatus 100 may further include a defect detection circuit 900 for detecting short circuits of elements disposed on the driving voltage line DVL.

The defect detection circuit 900 may include a third transistor T3, a switching control circuit 151, a defect detection base voltage supply circuit 152, and a defect sensing circuit 153.

The third transistor T3 may be connected to the cathode electrode of the OLED and electrically connected to a base voltage node N(EVSS) to which the base voltage EVSS is applied. The third transistor T3 may be an NMOS transistor. The third transistor T3 may electrically connect the base voltage node N(EVSS) to which the base voltage EVSS is applied to a ground GND or switch the base voltage node N(EVSS) to a floating state according to a control signal of the switching control circuit 151. The third transistor T3 may be an n-type transistor, but is not limited thereto. The third transistor T3 may be referred to as a base voltage switching transistor.

The switching control circuit 151 may control the switching of the third transistor T3 based on a voltage of the base voltage node N(EVSS), which is sensed by the defect sensing circuit 153. The switching control circuit 151 may be electrically connected to the gate node of the third transistor T3 by a switching signal line BDP_TL.

The switching control circuit 151 may electrically connect the base voltage node N(EVSS) to which the base voltage EVSS is applied to the ground GND or switch the base voltage node N(EVSS) to a floating state under the control of the controller 140.

The base voltage supply circuit 152 for defect detection may supply the defect detection base voltage to the base voltage node N(EVSS). The defective detection base voltage supply circuit 152 may be connected to the base voltage node N(EVSS) by a defect detection base voltage line BDP_VL. For example, the defect detection base voltage may be substantially the same as the base voltage EVSS, and the defect detection base voltage supply circuit 152 may be a base voltage supply source, but the present disclosure is not limited thereto.

According to a design, the driving voltage line DVL may be used as the defect detection base voltage line BDP_VL, but is not limited thereto.

The defect sensing circuit 153 may be connected to the base voltage node N(EVSS) by the defect sensing line BDP_SL. The defect sensing circuit 153 may sense the voltage of the base voltage node N(EVSS) and generate a defect signal BDP based on the sensed voltage of the base voltage node N(EVSS). The defect sensing circuit 153 may output the generated defect signal BDP to other components of the display apparatus 100, for example, at least one of the controller 140, the data driving circuit 120, the gate driving circuit 130, the power management integrated circuit 150, and the main power management circuit 160.

The defect sensing circuit 153 may compare the voltage of the base voltage node N(EVSS) with a preset reference value (or a reference range), determine whether a short circuit occurs in the driving voltage line DVL, and output the defect signal BDP. For example, the defect sensing circuit 153 may output the defect signal BDP when the voltage sensed at the base voltage node N(EVSS) during display driving is more than or equal to the preset reference value.

The switching control circuit 151, the defect detection base voltage supply circuit 152, and the defect sensing circuit 153 may be included in the power management integrated circuit 150. However, the present disclosure is not limited thereto, and the switching control circuit 151, the defect detection base voltage supply circuit 152, and the defect sensing circuit 153 may be implemented as components separately from the power management integrated circuit 150.

The display apparatus 100 may perform various operations corresponding to the defect signal BDP based on the generated defect signal BDP. For example, the defect signal BDP may be output to a driving voltage blocking circuit 800 (see FIG. 6) to be described below so that the driving voltage EVDD supplied to the display panel 110 may be blocked.

Figure 6:
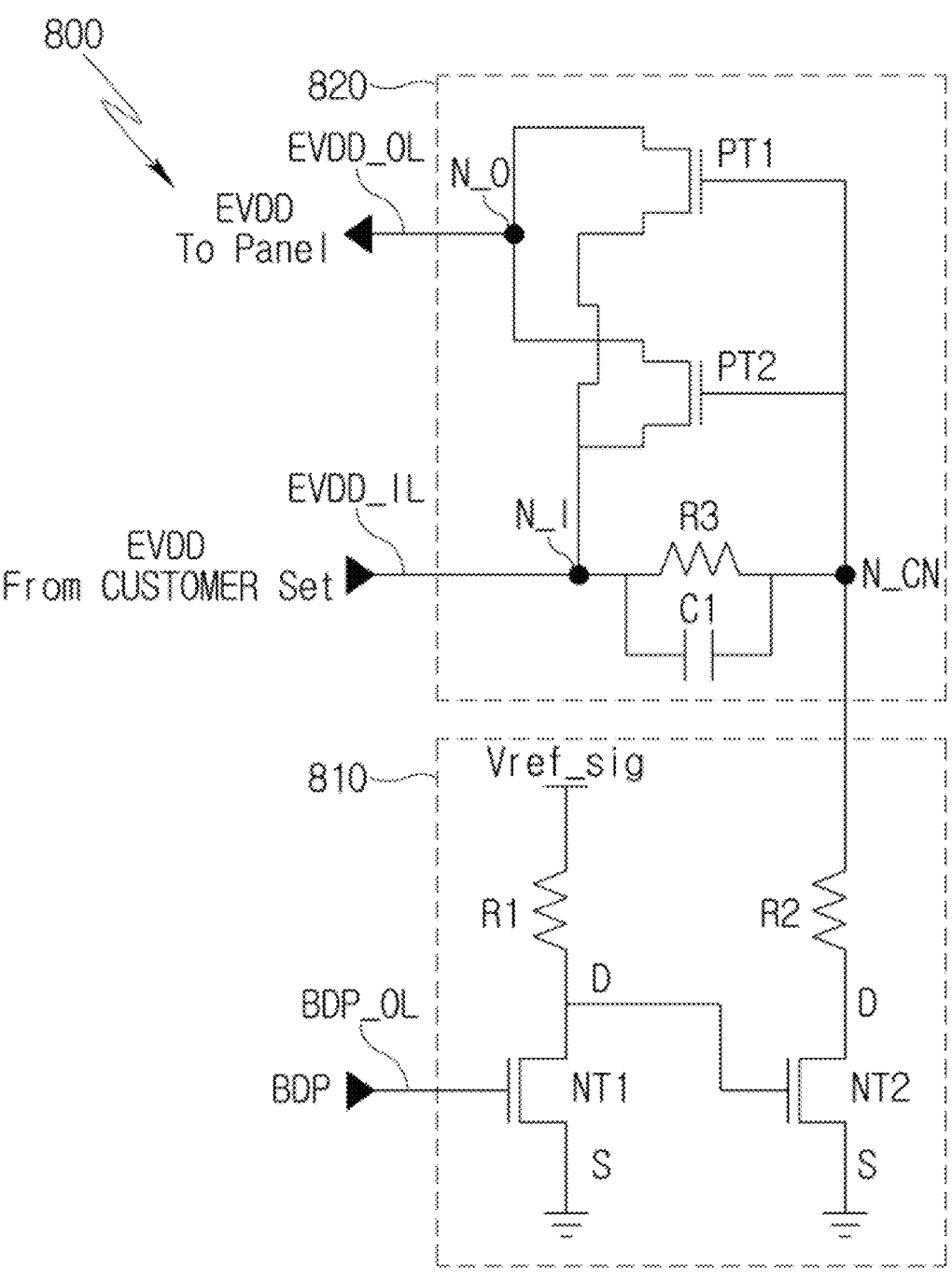
FIG. 6 is a view illustrating an exemplary circuit configuration of a driving voltage blocking circuit according to a comparative example of the present disclosure.

FIG. 6 is a view illustrating an exemplary circuit configuration of a driving voltage blocking circuit according to a comparative example of the present disclosure.

The display apparatus 100 may further include the driving voltage blocking circuit 800 mounted on a control printed circuit board CPCB to block the driving voltage EVDD supplied to the driving voltage line DVL when the defect signal BDP occurs.

The driving voltage blocking circuit 800 may be included in the power management integrated circuit 150, but is not limited thereto. The driving voltage blocking circuit 800 may be implemented as a component separately from the power management integrated circuit 150.

The driving voltage blocking circuit 800 may include a defect signal reception circuit 810 for receiving a defect signal from the defect detection circuit 900 and a driving voltage control circuit 820.

The defect signal reception circuit 810 includes a first n-type transistor NT1, a second n-type transistor NT2, a first resistor R1, and a second resistor R2.

A gate node of the first n-type transistor NT1 may be electrically connected to a defect signal output line BDP_OL. A source node of the first n-type transistor NT1 may be connected to the ground, and a drain node thereof may be connected to one side of the first resistor R1. A high-level signal control reference voltage Vref_sig may be supplied to the other side of the first resistor R1.

A gate node of the second n-type transistor NT2 may be connected to the drain node of the first n-type transistor NT1. A source node of the second n-type transistor NT2 may be connected to the ground, and a drain node thereof may be connected to one side of the second resistor R2. The other side of the second resistor R2 may be connected to a connection node N_CN.

The driving voltage control circuit 820 may include a first p-type transistor PT1, a second p-type transistor PT2, a third resistor R3, and a first capacitor C1.

The third resistor R3 and the first capacitor C1 may be connected in parallel between a driving voltage input node N_I and the connection node N_CN.

Gate nodes of the first and second p-type transistors PT1 and PT2 may be connected to the connection node N_CN, source nodes thereof may be connected to the driving voltage input node N_I, and drain nodes thereof may be connected to a driving voltage output node N_O.

The driving voltage EVDD output from the main power management circuit 160 of a set board 170 may be input to the driving voltage input node N_I through a driving voltage input line EVDD_IL.

Since the driving voltage output node N_O may be connected to a driving voltage output line EVDD_O, the driving voltage EVDD may be output. The driving voltage output line EVDD_O may be electrically connected to the driving voltage line DVL to supply the driving voltage EVDD to the sub-pixels SP disposed on the display panel 110.

When the driving voltage line DVL is normal, a low-level signal may be applied through the defect signal output line BDP_OL so that the first n-type transistor NT1 may maintain the turned-off state. The high-level signal control reference voltage Vref_sig may be applied to the gate node of the second n-type transistor NT2 so that the second n-type transistor NT2 may maintain the turned-on state. A low-level voltage may be applied to the gate nodes of the first and second p-type transistors PT1 and PT2 so that the first and second p-type transistors PT1 and PT2 may maintain the turned-on states. Accordingly, the driving voltage EVDD may be output to the display panel 110 through the driving voltage output line EVDD_O.

When the driving voltage line DVL is detected as defective, the high-level defect signal BDP may be applied through the defect signal output line BDP_OL to turn on the first n-type transistor NT1. The low-level voltage (the ground voltage) may be applied to the gate node of the second n-type transistor N2 to turn off the second n-type transistor NT2. The high-level voltage (the driving voltage EVDD) may be applied to the gate nodes of the first and second p-type transistors PT1 and PT2 to turn off the first and second p-type transistors PT1 and PT2. Accordingly, the driving voltage EVDD can be blocked from being output to the display panel 110 through the driving voltage output line EVDD_O.

Meanwhile, when the driving voltage EVDD is blocked using the driving voltage blocking circuit 800 as described above, there are disadvantages in that the configuration of the display apparatus 100 is complicated, the manufacturing cost increases, and the heat generation of the control printed circuit board CPCB on which the driving voltage blocking circuit 800 is mounted becomes severe.

Hereinafter, the display apparatus 100 capable of blocking the driving voltage EVDD when the defect signal BDP is detected without using the driving voltage blocking circuit 800 will be described with reference to FIGS. 7 to 9.

Figure 7:
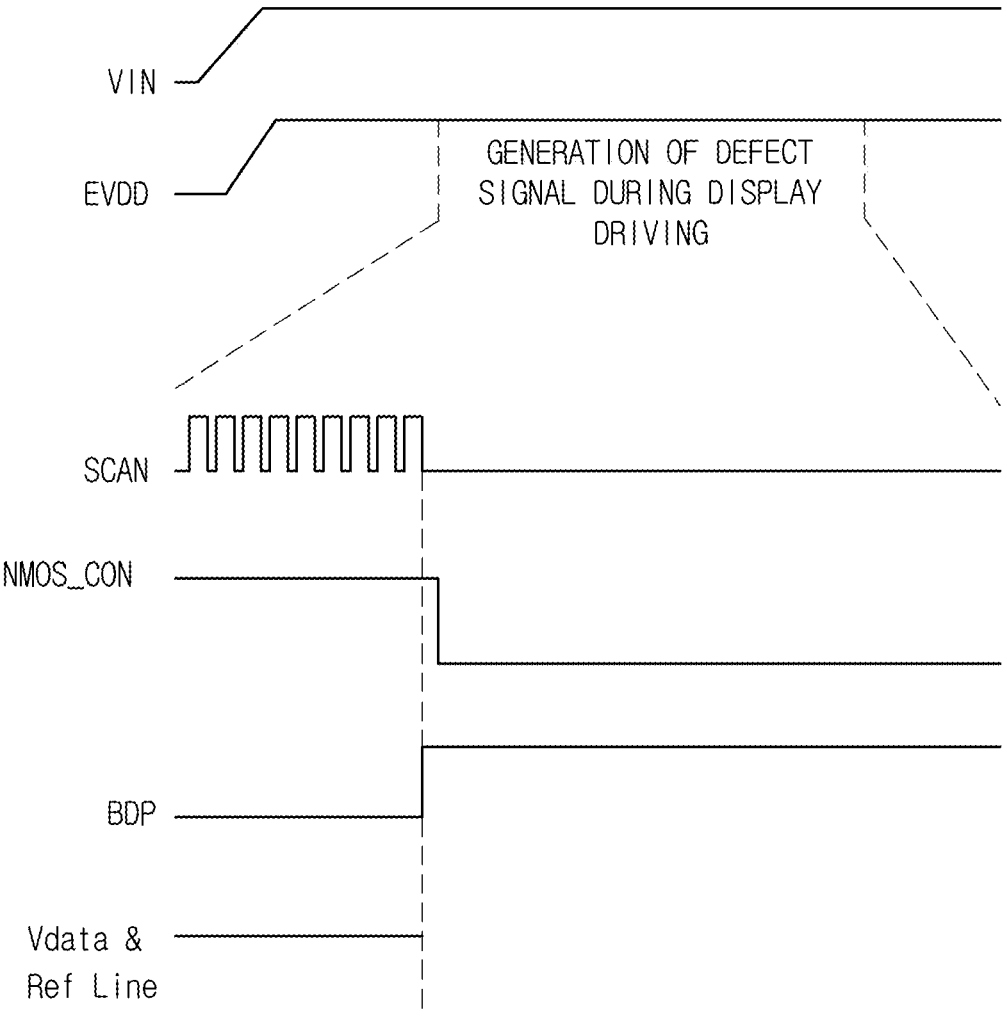
FIG. 7 is a view illustrating a driving timing diagram when a defect signal is generated according to the embodiments of the present disclosure.

FIG. 7 is a view illustrating a driving timing diagram when a defect signal is generated according to the embodiments of the present disclosure. FIG. 8 is a view illustrating the operation of the display apparatus when a defect signal is generated according to the embodiments of the present disclosure.

Figure 8:
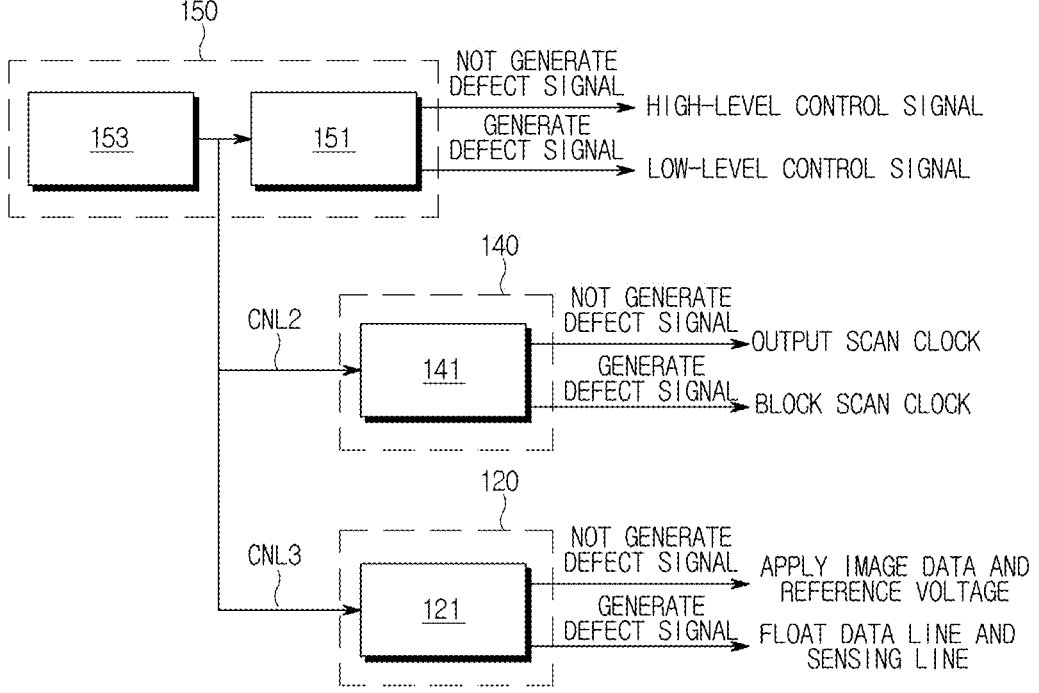
FIG. 8 is a view illustrating the operation of the display apparatus when a defect signal is generated according to the embodiments of the present disclosure.

Referring to FIGS. 5, 7, and 8, a DC input voltage VIN may be applied to the power management integrated circuit 150 during the driving of the display apparatus, and the driving voltage EVDD may be applied to the driving voltage line DVL.

During normal display driving, the defect sensing circuit 153 may output a control signal for display driving to the switching control circuit 151 and/or the controller 140. When the control signal is output to the switching control circuit 151, the switching control circuit 151 may output a high-level control signal NMOS_CON through the switching signal line BDP_TL based on the received control signal, and the third transistor T3 may maintain the turned-on state. When the control signal is output to the controller 140, the controller 140 may control the switching control circuit 151 to output the high-level control signal NMOS_CON through the switching signal line BDP_TL based on the received control signal.

The controller 140 may further include a gate clock control circuit 141 for controlling an output of the gate control signal GCS output to the gate driving circuit 130 based on the control signal received from the defect sensing circuit 153.

The gate control signal GCS may include a scan clock signal. For example, the scan clock signal may be a gate shift clock GSC.

During normal display driving, the defect sensing circuit 153 may output a display driving control signal to the gate clock control circuit 141. The gate clock control circuit 141 may output the scan clock signal to the gate driving circuit 130 based on the received control signal, and the gate driving circuit 130 may output the display driving scan signal SCAN through the gate line GL.

The data driving circuit 120 may include a voltage line control circuit 121 for controlling outputs of the data voltage and the reference voltage Vref based on the control signal received from the defect sensing circuit 153.

During normal display driving, the defect sensing circuit 153 may output the display driving control signal to the voltage line control circuit 121. The voltage line control circuit 121 may control the data voltage output circuit 136 so that the image data Vdata is output to the data line DL based on the received control signal and control the switches SPRE and RPRE so that the reference voltage Vref is output to the sensing line SL.

Meanwhile, when a defect of the driving voltage line DVL is detected by the defect detection circuit 900, the defect sensing circuit 153 may generate the defect signal BDP and output the defect signal BDP to at least one of the switching control circuit 151, the controller 140, and the data driving circuit 120.

The switching control circuit 151 may output the low-level control signal NMOS_CON through the switching signal line BDP_TL based on the received defect signal BDP, and the third transistor T3 may be turned off. Accordingly, the base voltage node N(EVSS) may be floated, and a path of a current that flows along the driving voltage line DVL may be blocked.

According to a design, the switching control circuit 151 may output the low-level control signal NMOS_CON after a preset time has elapsed from the time point at which the defect signal BDP is received in order to discharge the driving voltage line DVL, but is not limited thereto.

The gate clock control circuit 141 may stop or block the output of the scan clock signal to the gate driving circuit 130 based on the defect signal BDP received from the defect sensing circuit 153. Accordingly, the gate driving circuit 130 may no longer output the display driving scan signal SCAN through the gate line GL.

As the output of the scan signal SCAN is stopped, the data line DL and the sensing line SL are no longer connected to the driving voltage line DVL, and damage to the display apparatus 100 due to overcurrent can be prevented.

The voltage line control circuit 121 may control the connection of the data line DL and the reference voltage line SL based on the defect signal BDP received from the defect sensing circuit 153. The voltage line control circuit 121 may float the data line DL and the reference voltage line SL when receiving the defect signal BDP.

The voltage line control circuit 121 may include a floating control circuit connected to the data line DL and the reference voltage line SL to control their floating. The floating control circuit may include at least one switching element connected to the data line DL and the reference voltage line SL to float the data line DL and the reference voltage line SL. The floating control circuit may include the data voltage output circuit 136 and/or the switches SAM, SPRE, and RPRE, but is not limited thereto.

When the defect signal BDP is generated, the operation of floating the data line DL and the reference voltage line SL inside the data driving circuit 120 may be performed. Accordingly, when the driving voltage line DVL and the data line DL and/or the driving voltage line DVL and the sensing line SL are directly short-circuited, the path of the current that flows along the lines may be blocked.

The display apparatus may further include lines for the defect detection and driving voltage blocking operation of the driving voltage line DVL. Hereinafter, the lines will be described with reference to FIG. 9.

Figure 9:
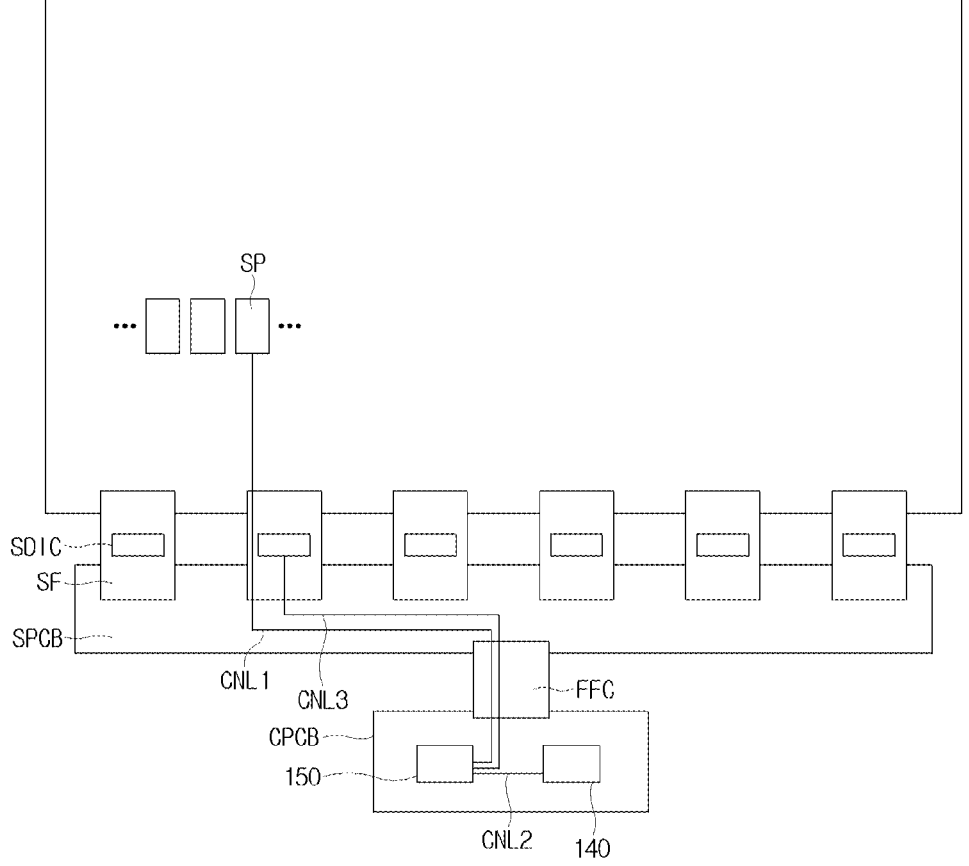
FIG. 9 is a plan view of the display apparatus according to the embodiments of the present disclosure.

FIG. 9 is a plan view of the display apparatus according to the embodiments of the present disclosure.

Hereinafter, an example in which the defect detection circuit 900 is included in the power management integrated circuit 150 will be described. However, as described above, the defect detection circuit 900 may be implemented separately from the power management integrated circuit 150. In this case, it will be obviously understood to those skilled in the art that the power management integrated circuit 150 below refers to the defect detection circuit 900.

Referring to FIG. 9, the display apparatus 100 may include a first connection line CNL1 electrically connecting the power management integrated circuit 150 to the sub-pixel SP, a second connection line CNL2 electrically connecting the power management integrated circuit 150 to the controller 140, and a third connection line CNL3 electrically connecting the power management integrated circuit to the data driving circuit.

The first connection line CNL1 may be disposed across the control printed circuit board CPCB, a connection member FFC, a source printed circuit board SPCB, a source-side circuit film SF, and the display panel 110. The first connection line CNL1 may be disposed across a display area in which an image is displayed in the display panel 110 and a non-display area surrounding at least a part of the display area.

Referring to FIGS. 5, 8, and 9, the first connection line CNL1 may include at least one of the switching signal line BDP_TL, the defect sensing line BDP_SL, and the defect detection base voltage line BDP_VL. That is, the first connection line CNL1 is a line connecting the defect detection circuit 900 to the sub-pixel SP and may refer to at least one of the switching signal line BDP_TL, the defect sensing line BDP_SL, and the defect detection base voltage line BDP_VL.

Referring to FIGS. 8 and 9, the second connection line CNL2 may be disposed on the control printed circuit board CPCB to electrically connect the power management integrated circuit 150 to the controller 140. The control signal and the defect signal BDP for display driving may be output from the defect sensing circuit 153 to the gate clock control circuit 141 through the second connection line CNL2.

A third connection line CNL3 may be disposed across the control printed circuit board CPCB, the connection member FFC, the source printed circuit board SPCB, and the source-side circuit film SF. The control signal and the defect signal BDP for display driving may be output from the defect sensing circuit 153 to the gate clock control circuit 121 through the third connection line CNL3.

The display apparatus 100 according to the embodiments of the present disclosure may control the controller 140, the data driving circuit 120, the gate driving circuit 130, and the third transistor T3 based on the defect signal BDP, thereby preventing damage to the display apparatus 100 due to an overcurrent when a defect occurs in the driving voltage line DVL. In addition, the display apparatus 100 may omit the driving voltage blocking circuit 800 under the control of the display apparatus 100, thereby avoiding the complicated structure of the display apparatus 100 and reducing the manufacturing cost. Furthermore, the conventional driving voltage blocking circuit 800 mounted on the control printed circuit board CPCB may be omitted, thereby reducing the heat generation of the control printed circuit board CPCB.

The above description and the accompanying drawings are merely illustrative of the technical spirit of the present disclosure, and those skilled in the art to which the present disclosure pertains can perform various changes or modifications, such as coupling, separation, substitution, and change of components, without departing from the essential characteristics of the present disclosure. Accordingly, the embodiments disclosed herein are not intended to limit the technical spirit of the present disclosure, but to describe the same, and the scope of the technical spirit of the present disclosure is not limited by these embodiments. The scope of the present disclosure should be construed to include all technical spirits described in the present disclosure.

Description of Reference Numerals

100: display apparatus

110: display panel

120: data driving circuit

130: gate driving circuit

140: controller

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a display panel on which a plurality of sub-pixels is disposed, the plurality of sub-pixels each including an organic light-emitting diode including a cathode electrode;
a base voltage node connected to the cathode electrode of the organic light-emitting diode;
a plurality of driving voltage lines disposed on the display panel and configured to supply a driving voltage of the organic light-emitting diode to the plurality of sub-pixels;
a controller configured to control a gate driving circuit and a data driving circuit; and
a defect detection circuit configured to determine whether a defect occurs in a driving voltage line among the plurality of driving voltage lines based on a voltage sensed at the base voltage node,
wherein, based on a defect signal output from the defect detection circuit, an output of at least one of the controller, the gate driving circuit, and the data driving circuit is controlled.

2. The display apparatus of claim 1, wherein the defect detection circuit outputs the defect signal when the voltage sensed at the base voltage node is a preset reference value or more.

3. The display apparatus of claim 1, wherein the defect detection circuit includes:
a base voltage switching transistor connected to the base voltage node;
a switching control circuit configured to control switching of the base voltage switching transistor; and
a defect sensing circuit configured to compare the voltage sensed at the base voltage node to the preset reference value and output the defect signal.

4. The display apparatus of claim 3, wherein the defect sensing circuit outputs the defect signal to at least one of the switching control circuit, the controller, and the data driving circuit.

5. The display apparatus of claim 4, wherein the switching control circuit turns off the base voltage switching transistor so that the base voltage node is floated when receiving the defect signal.

6. The display apparatus of claim 4, wherein the controller includes a gate clock control circuit configured to control an output of a scan clock signal output to the gate driving circuit based on the defect signal.

7. The display apparatus of claim 6, wherein the gate clock control circuit stops the output of the scan clock signal when receiving the defect signal.

8. The display apparatus of claim 4, further comprising a plurality of data lines connected to the data driving circuit and the plurality of sub-pixels,
wherein the data driving circuit includes a voltage line control circuit configured to control floating of the data line and the reference voltage line based on the defect signal.

9. The display apparatus of claim 8, wherein the voltage line control circuit floats the data line and the reference voltage line when receiving the defect signal.

10. The display apparatus of claim 1, further comprising:
a source-side circuit film on which the data driving circuit is mounted and which is connected to the display panel;
a source printed circuit board connected to the source-side circuit film;
a connection member connected to the source printed circuit board; and a control printed circuit board which is connected to the source printed circuit board by the connection member and on which the controller is mounted,
wherein the defect detection circuit is mounted on the control printed circuit board.

11. The display apparatus of claim 10, further comprising a first connection line configured to connect the sub-pixel to the defect detection circuit.

12. The display apparatus of claim 11, wherein the first connection line is disposed across the control printed circuit board, the connection member, the source printed circuit board, the source-side circuit film, and the display panel.

13. The display apparatus of claim 11, wherein the first connection line is disposed across a display area and a non-display area of the display panel.

14. The display apparatus of claim 10, further comprising a second connection line disposed on the control printed circuit board and configured to transmit the defect signal from the defect detection circuit to the controller.

15. The display apparatus of claim 10, further comprising a third connection line disposed across the control printed circuit board, the connection member, the source printed circuit board, and the source-side circuit film and configured to connect the defect detection circuit to the data driving circuit.

16. A display apparatus comprising:
a plurality of sub-pixels each including an organic light-emitting diode including a cathode electrode;
a switching transistor connected to the cathode electrode of the organic light-emitting diode through a base voltage node;
a switching control circuit configured to control switching of the switching transistor;
a defect sensing circuit configured to compare a voltage sensed at the base voltage node to a preset reference value and output a defect signal; and
a controller configured to control a gate driving circuit and a data driving circuit that are connected to the plurality of sub-pixels,
wherein, based on the defect signal output from the defect sensing circuit, an output of at least one of the gate driving circuit, the data driving circuit, and the controller is controlled.

17. The display apparatus of claim 16, wherein the defect sensing circuit outputs the defect signal when the voltage sensed at the base voltage node is the preset reference value or more.

18. The display apparatus of claim 16, wherein the display apparatus further includes a base voltage switching transistor connected to the base voltage node, and
wherein the switching control circuit turns off the base voltage switching transistor so that the base voltage node is floated when receiving the defect signal.

19. The display apparatus of claim 16, further comprising:
a source-side circuit film on which the data driving circuit is mounted and which is connected to the display panel;
a source printed circuit board connected to the source-side circuit film;
a connection member connected to the source printed circuit board; and
a control printed circuit board which is connected to the source printed circuit board by the connection member and on which the controller is mounted,
wherein the defect detection circuit is mounted on the control printed circuit board.

* * * * *